(12) United States Patent
Enquist

(10) Patent No.: US 6,905,557 B2
(45) Date of Patent: Jun. 14, 2005

(54) THREE DIMENSIONAL INTEGRATED DEVICE

(75) Inventor: Paul M. Enquist, Cary, NC (US)

(73) Assignee: Ziptronix, Inc., Research Triangle Park, NC (US)

( * ) Notice: Subject to any disclaimer, the term of this patent is extended or adjusted under 35 U.S.C. 154(b) by 0 days.

(21) Appl. No.: 10/192,702

(22) Filed: Jul. 11, 2002

(65) Prior Publication Data

US 2002/0173120 A1 Nov. 21, 2002

Related U.S. Application Data

(62) Division of application No. 09/410,054, filed on Oct. 1, 1999.

(51) Int. Cl.⁷ .............................................. H01L 29/06
(52) U.S. Cl. ..................................... 148/33.3; 257/684
(58) Field of Search .............................. 148/33.3, 33.4, 148/33.5; 257/684

(56) References Cited

U.S. PATENT DOCUMENTS

| | | | |
|---|---|---|---|
| 4,829,018 A | 5/1989 | Wahlstrom | |
| 4,962,879 A | 10/1990 | Goesele et al. | |
| 5,087,585 A | * 2/1992 | Hayashi | 438/155 |
| 5,089,431 A | * 2/1992 | Slatter et al. | 438/193 |
| 5,196,375 A | 3/1993 | Hoshi | |
| 5,266,511 A | * 11/1993 | Takao | 438/401 |
| 5,272,104 A | 12/1993 | Schrantz et al. | |
| 5,321,301 A | 6/1994 | Sato et al. | |
| 5,362,659 A | 11/1994 | Cartagena | |
| 5,376,579 A | 12/1994 | Annamalai | |
| 5,380,681 A | 1/1995 | Hsu | |
| 5,407,856 A | 4/1995 | Quenzer et al. | |
| 5,441,591 A | 8/1995 | Imthurn et al. | |
| 5,441,911 A | 8/1995 | Malhi | |
| 5,459,104 A | * 10/1995 | Sakai | 438/406 |
| 5,485,540 A | 1/1996 | Eda | |
| 5,514,235 A | 5/1996 | Mitani et al. | |
| 5,546,494 A | 8/1996 | Eda | |
| 5,548,178 A | 8/1996 | Eda et al. | |
| 5,561,303 A | 10/1996 | Schrantz et al. | |
| 5,563,084 A | * 10/1996 | Ramm et al. | 438/15 |

(Continued)

OTHER PUBLICATIONS

Tong, Qin–Yi, et al, "Low Temperature Wafer Direct Bonding", IEEE 1994, Journal of Microelectomechanical Systems, vol. 3, No. 1, Mar. 1994, pp. 29–35.*

(Continued)

*Primary Examiner*—George Fourson
(74) *Attorney, Agent, or Firm*—Oblon, Spivak, McClelland, Maier & Neustadt, P.C.

(57) ABSTRACT

A device integration method and integrated device. The method includes the steps of polishing surfaces of first and second workpieces each to a surface roughness of about 5–10 Å. The polished surfaces of the first and second workpieces are bonded together. A surface of a third workpiece is polished to the surface roughness. The surface of the third workpiece is bonded to the joined first and second workpieces. The first, second and third workpieces may each be a semiconductor device having a thin material formed on one surface, preferably in wafer form. The thin materials are polished to the desired surface roughness and then bonded together. The thin materials may each have a thickness of approximately 1–10 times the surface non-planarity of the material on which they are formed. Any number of devices may be bonded together, and the devices may be different types of devices or different technologies.

45 Claims, 7 Drawing Sheets

U.S. PATENT DOCUMENTS

| | | | |
|---|---|---|---|
| 5,580,407 A | 12/1996 | Haisma et al. | |
| 5,591,678 A | 1/1997 | Bendik et al. | |
| 5,647,932 A | 7/1997 | Taguchi et al. | |
| 5,650,353 A | 7/1997 | Yoshizawa et al. | |
| 5,652,436 A | 7/1997 | Stoner et al. | |
| 5,661,316 A | 8/1997 | Kish, Jr. et al. | |
| 5,666,706 A | 9/1997 | Tomita et al. | |
| 5,668,057 A | 9/1997 | Eda et al. | |
| 5,672,240 A | 9/1997 | Stoner et al. | |
| 5,698,471 A | 12/1997 | Namba et al. | |
| 5,741,733 A * | 4/1998 | Bertagnolli et al. | 438/152 |
| 5,747,857 A | 5/1998 | Eda et al. | |
| 5,755,914 A | 5/1998 | Yonehara | |
| 5,759,753 A | 6/1998 | Namba et al. | |
| 5,763,318 A | 6/1998 | Bertin et al. | |
| 5,766,984 A * | 6/1998 | Ramm et al. | 438/109 |
| 5,771,555 A | 6/1998 | Eda et al. | |
| 5,785,874 A | 7/1998 | Eda et al. | |
| 5,821,665 A | 10/1998 | Onishi et al. | |
| 5,849,627 A | 12/1998 | Linn et al. | |
| 5,851,894 A * | 12/1998 | Ramm | 438/311 |
| 5,872,025 A | 2/1999 | Cronin et al. | |
| 5,877,034 A * | 3/1999 | Ramm et al. | 438/15 |
| 5,877,516 A | 3/1999 | Mermagen et al. | |
| 5,880,010 A | 3/1999 | Davidson | |
| 5,902,118 A * | 5/1999 | Hubner | 438/106 |
| 5,910,699 A | 6/1999 | Namba et al. | |
| 5,920,142 A | 7/1999 | Onishi et al. | |
| 5,982,010 A | 11/1999 | Namba et al. | |
| 5,991,989 A | 11/1999 | Onishi et al. | |
| 6,004,866 A * | 12/1999 | Nakano et al. | 438/459 |
| 6,018,211 A | 1/2000 | Kanaboshi et al. | |
| 6,087,760 A | 7/2000 | Yamaguchi et al. | |
| 6,120,917 A | 9/2000 | Eda | |
| 6,146,992 A * | 11/2000 | Lauterbach et al. | 438/623 |
| 6,154,940 A | 12/2000 | Onishi et al. | |
| 6,197,663 B1 | 3/2001 | Chandross et al. | |
| 6,236,141 B1 | 5/2001 | Sato et al. | |
| 6,270,202 B1 | 8/2001 | Namba et al. | |
| 6,448,174 B1 * | 9/2002 | Ramm | 438/637 |
| 6,563,224 B2 * | 5/2003 | Leedy | 257/778 |
| 6,593,184 B2 * | 7/2003 | Han | 438/253 |

OTHER PUBLICATIONS

Gosele, U., et al, "Semiconductor Wafer Bonding, A Flexible Approach to Materials Combinations in Microelectronics, Micromechanics and Optoelectronics", 1997 IEEE, pp. 23–32.*

Takagi, Hideki, et al, "Low Temperature Direct Bonding of Silicon and Silicon Dioxide by the Surface Activation Method", Transducers 1997, 1997 Int. Conf. on Solid State Sensors and Actuators Jun. 16–19, 1997, pp. 657–660.*

Studies of SiO2–SiO2 Bonding with Hydrofluoric Acid—Room Temperature and Low Stress Bonding Technique for Mems, 1998 IEEE, pp. 609–614.*

* cited by examiner

THREE DIMENSIONAL INTEGRATED DEVICE

BACKGROUND OF THE INVENTION

1. Field of the Invention

The present invention relates to three-dimensionally integrated semiconductor devices and, in particular, to semiconductor devices vertically bonded together to form three-dimensional structures.

2. Discussion of the Background

The ability to integrate determines the success of the semiconductor industry. This was first demonstrated with the invention of the integrated circuit (IC). The IC essentially consists of fabrication of electronic components at the surface of the semiconductor wafer followed by interconnection of these components with metalization on top of the components. The dramatic reduction in cost and increase in performance that has resulted from this integration has had a profound economic impact.

Since the invention of the IC, the semiconductor industry has experienced continued rapid growth due to continuous improvements in the integration density of various electronic components (i.e., transistors, diodes, resistors, capacitors, etc.) achieved. For the most part, this improvement in integration density has come from repeated reduction in minimum feature size which allow more components to be integrated in a given area. Additional improvement has come from increases in wafer size.

These integration improvements are essentially two-dimensional (2-D) in nature, in that the volume occupied by the integrated components is essentially at the surface of semiconductor wafer. Although dramatic improvements in lithography have resulted in considerable improvement in this 2-D integration, there are physical limits to the density which can be achieved in 2-D. One of these limits is simply the minimum size needed to make these components. Another limit is the significant increase in interconnect requirements between components as the component size is reduced.

Efforts to achieve integration beyond that available with 2-D has been explored and resulted in improvement in chip memory and further semiconductor industry growth. For instance, the trench capacitor uses significant semiconductor volume below the wafer surface and allows more functionality to be achieve in a given chip area. Other efforts, directed at achieving higher levels of integration by increased use of the volume in a given chip area, have recently increased. One approach has been to iterate the integration process by adding semiconductor material on top of the interconnect metalization followed by additional interconnect metalization. Although this potentially results in more components per chip area, it suffers from other problems including significantly increased thermal budgets. In addition, this and other efforts are distinct in that they only use one substrate and then work on one surface of that substrate. Not subjecting the devices to the thermal processes involved in fabricating the interconnect would simplify and enhance the fabrication of the devices.

Another problem results from the lagging of the ability to scale interconnect dimensions compared to scaling device dimensions. Ideally, one wants the critical dimension of a via to be the same as a gate dimension. However, since the scaling of vias lags the scaling of devices, integration density is limited.

Further problems arise when trying to integrate different types of technologies into a single circuit or wafer. BiCMOS is one example. Typically, special processing techniques must be devised to be able to combine the technologies. Processes required for one technology often interfere with processes required for another. As a result, compromises are made. The overall development of the combined technology becomes frozen in time, making flexible integration of the technologies that are being combined very difficult if not impossible. In other words, the most advanced "best of breed" technologies are not combined and evolutions in the technologies cannot be exploited.

Another problem of combining technologies is that customization must occur up front. One must first design the processing to combine the technologies and thus the limitations are built into the device. Again, one cannot easily take advantage of evolutions and improvements in technology since that requires redesigning the processing.

SUMMARY OF THE INVENTION

It is an object of the present invention to provide a method and device having high integration density.

It is another object of the invention to provide a method and device where different types of materials may be integrated.

It is a further object of the present invention to provide a method of integrating different types of devices, and a structure comprising the integrated devices.

It is yet another object of the invention to provide a method and device where different types of technologies are integrated.

It is a still further object of the invention to avoid or minimize the thermal budgets in interconnecting devices.

It is yet another object of the invention to allow the integration of the best available technologies without making significant processing compromises.

These and other objects of the invention may be achieved by a method of bonding including polishing respective first surfaces of first, second and third workpieces each to a desired surface roughness, bonding together said first surfaces of said first and second workpieces, polishing a second surface of one of said first and second workpieces after bonding to said surface roughness, and bonding said first surface of said third workpiece to said polished second surface.

The surfaces may be polished to a roughness of no more than about 5–10 Å. The first workpiece may be obtained by forming a thin first material on a second material, the second workpiece may be obtained by forming a thin third material on a fourth material, and the third workpiece may be obtained by forming a fifth material on a sixth material. The method may include the steps of polishing the first, third and fifth materials to obtain the first surfaces.

The first and third materials may each be formed of a material having a high thermal conductivity and a high dielectric constant. The first, third and fifth materials may be selected from the group consisting of silicon dioxide, silicon and diamond-like carbon. The first, third and fifth materials may be formed to a thickness of about 1–10 times a surface non-planarity of the second, fourth and sixth materials, respectively.

The method may also include the steps of forming first through third semiconductor devices on respective first through third substrates as the first-third workpieces. Surfaces of the first and second semiconductor devices may be polished to obtain the respective first and second surfaces. In this example, a first material may be formed on the surface of the first semiconductor device and a second material may be formed on the surface of the second semiconductor device. The first and second materials may be polished to obtain the respective first and second surfaces.

An exposed surface of one of the first and second semiconductor devices may be polished to a desired surface roughness after bonding the first and second surfaces, and the first surface of the third semiconductor device may be bonded with the exposed surface.

In another example, an exposed surface of one of the first and second semiconductor devices may be polished to a surface roughness of no more than about 5–10 Å after bonding the first and second surfaces. Surfaces of N-2 semiconductor devices may be polished each having a surface roughness of about no more than 5–10 Å. The N-2 semiconductor devices may be bonded to the bonded first and second semiconductor devices to obtain an N-integrated bonded device. Substrates of each of the N-2 semiconductor devices may be removed in the integration process.

The first-third semiconductor devices may each comprise integrated circuits formed on substrates. One of the substrates of the first and second semiconductor devices may be removed after the bonding step. A surface exposed by removing the substrate may be polished to a surface roughness of about no more than 5–10 Å, a surface of a third semiconductor device may be polished to a surface roughness of about no more than 5–10 Å, and the surface of the third semiconductor device and the polished exposed surface may be bonded.

The method may also include the steps of using a surrogate substrate as the first workpiece, forming an integrated circuit on a second substrate as the second workpiece, polishing a surface of the first substrate, polishing a surface of the integrated circuit, and bonding the first substrate and the integrated circuit. A second surface of the integrated circuit may be polished, a second integrated circuit may be formed on a third substrate as the third workpiece, a surface of the second integrated circuit may be polished, and the polished surface of the second integrated circuit may be bonded to the first integrated circuit.

A first material may be formed on the surface of the substrate and polished. A second material may be formed on the surface of the integrated circuits and polished. The first and second materials may be formed to a thickness of about 1–10 times a surface non-planarity of the surfaces of the substrate and integrated circuits, respectively.

The method may also include steps of forming N thin films on a first material to obtain the first workpiece and polishing an uppermost one of the N films to obtain the desired surface roughness, and forming M thin films on a second material to obtain the second workpiece and polishing an uppermost one of the M thin films to obtain the desired surface roughness. The method may also include at least one of the steps of polishing at least plural of the N thin films and polishing at least plural of the M thin films.

A surrogate substrate may be used as the first workpiece. A stress relieving layer may be formed on the surrogate substrate. A thin film may be formed on the stress relieving layer and the thin film may be polished to obtain the desired surface roughness.

The method may also include interconnecting the semiconductor devices. The connections may be between circuits or between individual devices. Interconnecting the two devices may include bonding a multi-layer interconnection to one of the devices after bonding the two devices.

After bonding the first and second semiconductor devices, one of the substrates may be removed to expose a surface. This surface may be polished and a third semiconductor device may be bonded to the polished exposed surface.

Semiconductor devices and integrated circuits of different technologies may be integrated.

The method according to the invention may also comprise bonding a first semiconductor device having a first substrate to a second semiconductor device having a second substrate, removing a portion of said first substrate to expose a remaining portion of said first semiconductor device, and interconnecting said first and second semiconductor devices.

Substantially all of the substrate may be removed. Surfaces of the first and second devices may be planarized and bonded. Interconnecting the devices may comprises bonding a multi-layer interconnection to one of the devices. A surrogate substrate may be bonded to one the devices, and the corresponding substrate removed. The other of the devices may be bonded to the portion exposed by removing the substrate.

A third device may be bonded to the first and second devices, and the three devices may be interconnected. A substrate of the third device may be removed before interconnection.

The objects of the invention may also be achieved by a bonded device having a first workpiece having a first surface with a surface roughness and a second workpiece having respective second and third surfaces each having the surface roughness, the first and second surfaces being bonded together. A third substrate has a fourth surface with the surface roughness. The third and fourth surfaces are bonded together. The first workpiece may include a thin first material disposed upon second material, the second workpiece may include a thin third material disposed on a fourth material and the third workpiece may include a thin fifth material disposed on a sixth material. Surfaces of the thin first, third and fifth materials may comprise the first, second and fourth surfaces, respectively.

Each of the thin first, third and fifth materials may comprise a material having a high thermal conductivity and a high dielectric constant and may be selected from the group consisting of silicon, silicon dioxide and diamond-like silicon carbide. The thin first, third and fifth materials may have a thickness of about 1–10 times a surface non-planarity of the second, fourth and sixth materials, respectively. The thin first, third and fifth materials may each include a plurality of thin layers, an uppermost one of each of the plurality of layers comprising the first, second and fourth surfaces, respectively.

The first, second and third workpieces may comprise first, second and third semiconductor devices, respectively. The first, second and third semiconductor devices may comprise first, second and third integrated circuits, respectively. The first, second and third semiconductor devices may comprise first through third 2-D arrays of unconnected devices. The second and third devices may have substantially all of their respective substrates removed.

The first workpiece may comprise a surrogate substrate, and the second and third workpieces may each comprise a semiconductor device. The surrogate substrate may comprise a thin first material disposed upon a second material, where the first material comprises the first surface. The semiconductor devices may each include a thin material disposed on an integrated circuit and the thin materials comprises the second and third surfaces, respectively. The thin first, second and third materials may have a thickness of about 1–10 times a surface non-planarity of the second material and the two integrated circuits, respectively.

The first workpiece may include a thin first material, a second material and a stress relieving material formed between the thin first material and the second material, or the second workpiece may include a thin third material, a fourth material and a stress relieving material formed between the thin third material and the fourth material. Surfaces of the thin first and third materials may include the first and second surfaces, respectively.

The device according to the invention may also comprise an integrated device having a first semiconductor device, a second semiconductor device, comprised of a layer of devices formed on a substrate which has been at least partially removed, bonded to said first semiconductor device, and interconnections connecting said first and second semiconductor devices.

The second device may comprises said layer of devices formed on a substrate which has been substantially removed, and a third semiconductor device, comprised of a layer of devices formed on a substrate which has been at least partially removed, may be bonded to the second device. The interconnections may comprise a multi-layer interconnection bonded to the second device. The first device may comprise a layer of devices formed on a substrate which has been substantially removed bonded to a surrogate substrate, and the second device may comprise the layer of devices formed on a substrate which has been substantially removed. The second and third workpieces may be of different technologies.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
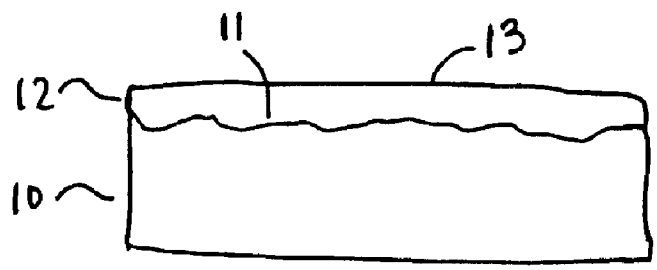
FIG. 1 is a sectional diagram illustrating a step in the method according to the invention.

Referring now to the drawings, and more particularly to FIG. 1 which illustrates a first embodiment of the method and device according to the invention. A substrate 10 has a upper surface 11 having a surface planarity. Substrate 10 preferably is a surrogate substrate or an integrated circuit wafer. The non-planarity of surface 11 shown in FIG. 1 is for illustrative purposes and is not meant to depict exact surface planarity conditions. Substrate 10 preferably has a relatively smooth and planar surface 11. The desired smoothness and planarity of the upper surface may be achieved through polishing. Chemical-mechanical polishing or CMP is one manner of achieving the desired smoothness and planarity. The CMP process is optimized with appropriate selection of polishing pads, polishing slurries and polishing conditions to obtain the desired surface roughness and planarity.

On surface 11 is deposited a film 12 having a thickness greater than the surface non-planarity of surface 11. Film 12 should have good thermal conductivity and a high dielectric constant, such as $SiO_2$, diamond or diamond-like carbon (DLC). Thermal conductivities in the range of 1–10 W/cmK and relative dielectric constants in the range of 1–3 are preferable. A preferable range of thickness for film 11 is from 1–10 times the surface non-planarity of film 11. The upper surface 13 of film 13 is then polished to a planar surface with a roughness of 5–15 Å and preferably between 5–10 Å. A planar surface with a roughness of $\leq 5$ Å is most preferred as a smoother planar surface will enhance the bonding properties of the film.

Figure 2:
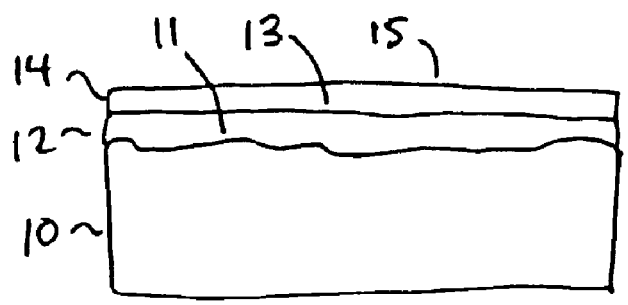
FIG. 2 is a sectional diagram illustrating a step in the method according to the invention.

It is also possible to deposit film 12, polish upper surface 13, and then deposit another film (14 in FIG. 2), and polish the second film, to achieve the desired smoothness of the upper surface (15 in FIG. 2). Three or more films, repeating the depositing and polishing operations for each or for at least the upper film, may be used to achieve the desired surface roughness and planarity.

Figure 3:
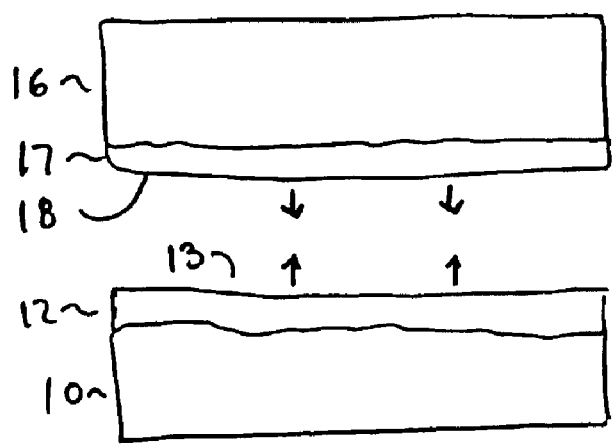
FIG. 3 is a sectional diagram illustrating bonding two substrates according to the invention.
Figure 4:
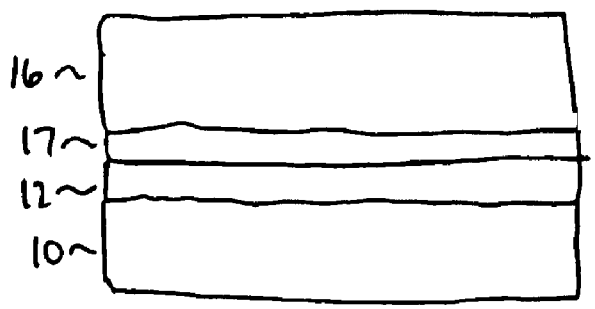
FIG. 4 is a sectional diagram a bonded device according to the invention.

The substrate 10 is now ready for wafer bonding. Any type of substrate may be bonded to substrate 10. Referring to FIG. 3, a substrate 16, preferably an integrated circuit wafer containing active devices, is prepared in the same manner as substrate 10 by forming a film 17 having an exposed surface 18 with a surface roughness in the same range as surface 13 of film 12 (or surface 15 of film 14). A higher degree of planarity will further facilitate the bonding process. Film 17 may be formed of one or more layers with one or more polishing operations, as described above. Surfaces 18 and 12 are brought into contact with each other (shown by the arrows in FIG. 3). A bond, such as a Van der Waals bond, between surfaces 18 and 13 is formed (FIG. 4). A stronger bond can be achieved by subsequently heating the joined substrates and films.

The preferred manner of bonding is direct bonding without the use of applied pressure, voltage or temperature. It the substrate has an upper surface of $SiO_2$ (or other bonding material), one can polish that surface without depositing another $SiO_2$ layer, assuming that the upper surface of $SiO_2$ has sufficient thickness to obtain a sufficient surface roughness and planarity with, e.g., CMP.

EXAMPLE

This example uses the case of attachment of a diamond substrate to a material such as GaAs, InP, or GaN when optimal thermal packaging and dielectric performance are desired. Bonding to a substrate of a material having a high thermal conductivity allows one to better manage thermal transfer. The diamond substrate, after preparing it for bonding, has a relatively smooth upper surface. As diamond substrates typically have a relatively rough surface, a relatively smooth and planar upper surface may be obtained by polishing. Polishing may be expensive and difficult to consistently obtain very smooth surfaces. It is also possible to form the diamond substrate on a copper susceptor. Diamond films typically "pop-off" the copper susceptor after deposition as the temperature is lowered, leaving a relatively smooth and planar surface where growth initiated and a rougher surface where growth terminated.

On top of the upper surface is deposited a thin layer of silicon dioxide. The silicon dioxide layer should be thicker than the non-planarity of the diamond surface, e.g., 1–10 times, but as thin as possible to optimize performance. The silicon dioxide layer is then polished to a smooth surface suitable for wafer bonding, for example, $\leq 5$ Å. The diamond substrate having the thin silicon layer is now ready for wafer bonding.

Figure 5:
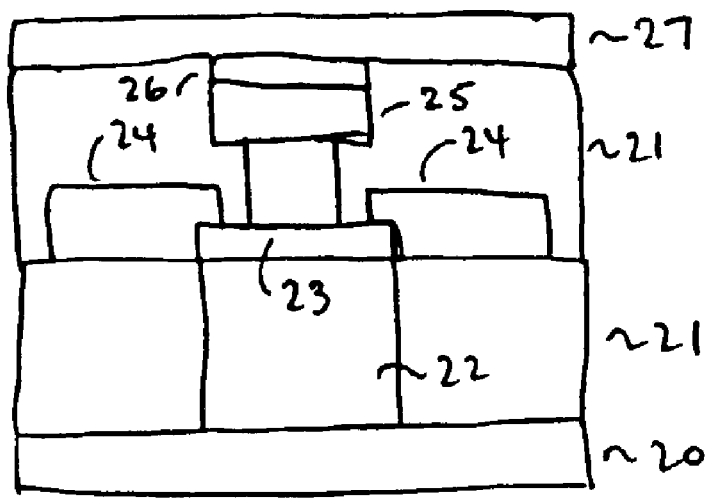
FIG. 5 is a sectional diagram of a heterojunction bipolar transistor.

At this point any type of device formed on any type of substrate may be bonded to the surface of silicon dioxide layer. For this example, a heterojunction bipolar transistor (HBT), as described in application Ser. No. 09/165,203, the disclosure of which is incorporated herein by reference, may be used. The HBT is processed to the point where it is ready for attachment of a surrogate substrate, as shown in FIG. 5. Typically, this would include the steps of forming the emitter metalization, performing base etching, applying base metalization, applying a passivation/planarization level and applying a thermal shunt. In FIG. 5 there is collector layer 22 formed on a GaAs substrate 20, planarizing material 21, base region 23, base contacts 24, emitter 25 and emitter contact 26. It should be noted that FIG. 5, while illustrating a single device, is not so limited. A wafer containing a number of devices or an integrated circuit may also be bonded in the same manner.

On top of the planarized surface of the HBT is deposited another very thin layer of silicon dioxide 27. The thickness of silicon dioxide layer 27 is thicker than the non-planarity of the planarized surface of the HBT (e.g., 1–10 times) but as thin as possible to optimize performance. The surface of the silicon dioxide layer 27 is polished to a smoothness sufficient for wafer bonding, for example $\leq 5$ Å. Layers 27 and 12 are then bonded by placing them in close proximity. The surfaces are preferably placed in close proximity after a wet cleaning process, followed by a drying operation to force the liquid from between the layers 27 and 12. A Van der Waals bond is formed. A stronger bond can be achieved by subsequently heating joined layers 27 and 12.

Figure 6:
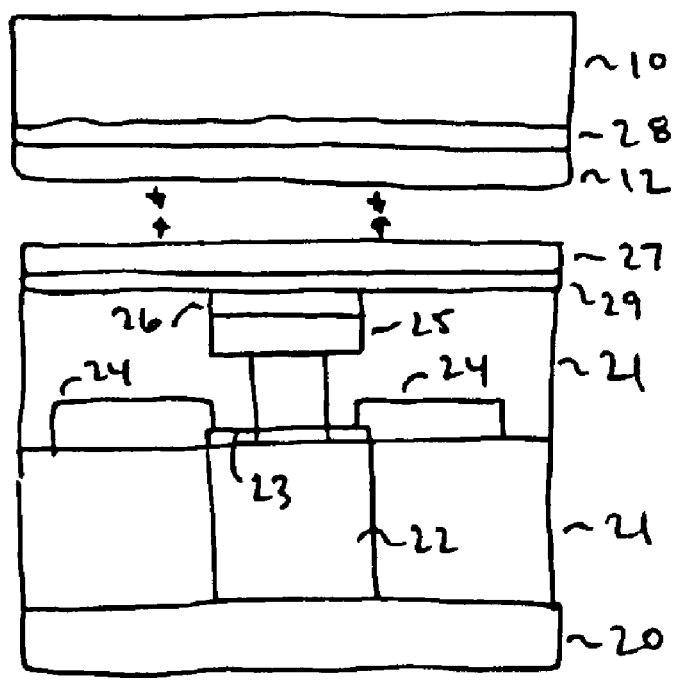
FIG. 6 is a sectional diagram illustrating bonding the transistor of FIG. 4 according to the invention.

When layers 12 and 27 are heated after joining, stress may be generated which lead to some deleterious effects in the formed device and surrogate substrate. It is possible to form a stress-relieving layer between the diamond substrate and silicon dioxide layer and between the HBT device and silicon dioxide layer 27. This is illustrated as films 28 and 29 in FIG. 6. The stress relieving layer is a homogeneous or composite layer with material, i.e., Young's modulus, such that this layer will yield the application of stress before other layers.

While the bonding has been described using a silicon dioxide film polished to a desired surface roughness, other films are possible. For example, silicon or DLC may also be used. In the case of silicon, oxygen may be implanted into the bonding layers below their respective surfaces to form a compliant layer. The compliant layer is a layer equivalent to the stress-relieving layer. One would prefer to use a Si, SiC or DLC film versus an $SiO_2$ film, when, for example, improved thermal conductivity is desired.

It is also possible to choose the passivation/planarization material in the device being bonded to optimize the dielectric constant, thermal conductivity and resistivity adjacent to the active device. In particular, DLC is effective due to it relatively high thermal conductivity and low dielectric constant compared to other materials.

As shown in FIG. 5, the HBT device 14 typically is formed on substrate 20. After bonding the device to substrate 10, substrate 20 can be removed through a process such as polishing, or grinding and polishing, allowing access to backside contacts.

Figure 7:
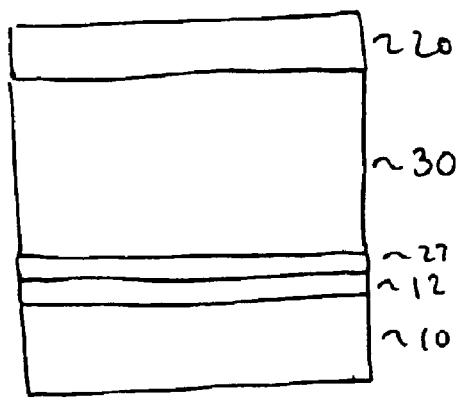
FIG. 7 is a sectional diagram of a bonded device according to the invention.
Figure 8:
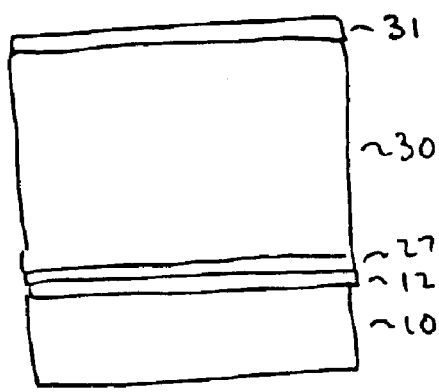
FIG. 8 is a sectional diagram illustrating a step in bonding together two devices according to the invention.

In a second embodiment of the invention, N 2D arrays of devices are bonded together by repeating the method described in the first embodiment N times. Starting with the bonded device shown in FIG. 7 (the HBT device is shown without the component detail as 30), the substrate 20 is removed and the exposed surface of device 30 is polished, if necessary, to a level of smoothness advantageous for wafer bonding. Polishing and grinding may be used during the removal of substrate 20. Another layer of silicon dioxide 31 is deposited on the exposed surface of device 30 and polished to the desired surface roughness, in a manner as described above for layers 12 or 27 (FIG. 8).

Figure 9:
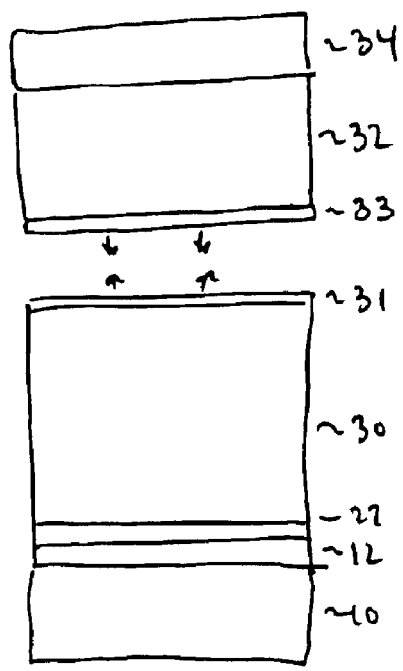
FIG. 9 is a sectional diagram illustrating a step in bonding together two devices according to the invention.
Figure 10:
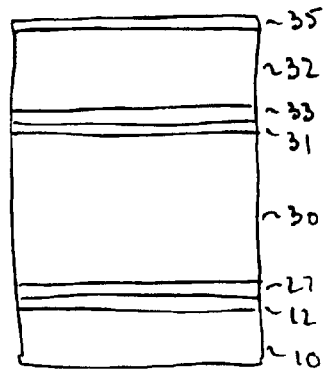
FIG. 10 is a sectional diagram illustrating two devices bonded according to the invention.

A next wafer, shown without the device details as 32 with substrate 34 in FIG. 9 has a thin layer of silicon dioxide 33 formed on the surface opposite substrate 34. Film 33 is formed and polished in the same manner as films 11, 27 and 31. Film 33 is then bonded to the exposed surface of layer 31. The resulting device is shown in FIG. 10, after removal of the substrate 34. The upper surface of the second bonded device may again be polished, another silicon dioxide layer 35 deposited in preparation for bonding of a third device. This can be N times to produce an N-integrated device. The devices so bonded may be interconnected vertically.

EXAMPLE

An example of the bonding between multiple devices is shown in FIGS. 11A, 11B and 12–15. FIGS. 11A, 11B and 12–15 illustrate how the bonding according to the present invention can be used to integrate N 2D arrays of devices, how they can be interconnected to form a vertically-integrated multi-wafer module, and how different technologies may be joined.

Figure 11A:
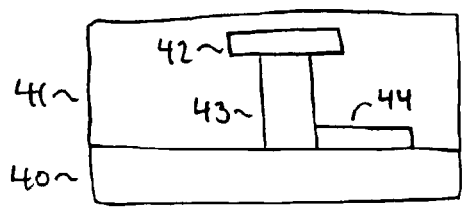
FIGS. 11A and 11B are sectional diagrams of two devices to be bonded according to the invention.
Figure 11B:
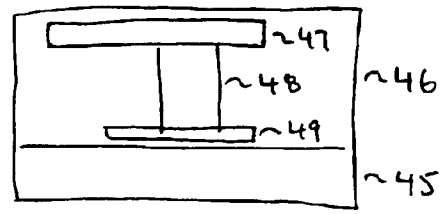
Figure 12:
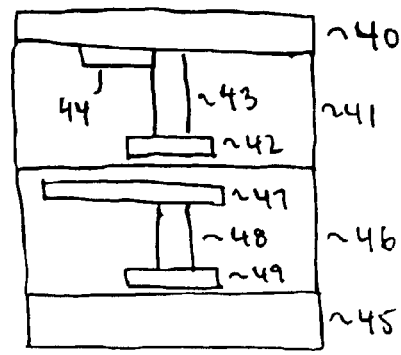
FIG. 12 is a sectional diagram illustrating bonding of the devices of FIGS. 11A and 11B.

FIGS. 11A and 11B illustrate two devices to be bonded. In this example, the devices of FIGS. 11A and 11B are dissimilar integrated circuit wafers having interconnections. In FIG. 11A a symmetric-intrinsic HBT (SIHBT) wafer contains an SIHBT surrogate substrate 40, planarizing material 41 formed on substrate 40, SIHBT device 43 and interconnects 42 and 44, preferably formed of a metal. FIG. 1B illustrates a VCSEL device having a VCSEL substrate 45, planarizing material 46, VCSEL device 48 and interconnects 47 and 49, again preferably formed of metal. As shown in FIG. 12, the devices of FIGS. 11A and 11B are bonded in the method as described above, that is, a material such as silicon dioxide is deposited on the upper surface of each device and then polished to a surface roughness of about 5–10 Å. A high degree of planarity is also desirable. The bonded devices are shown in FIG. 12.

Figure 13:
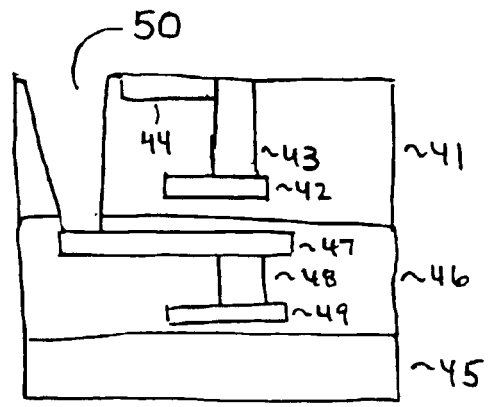
FIG. 13 is a sectional diagram illustrating a step of interconnecting the devices of FIGS. 11A and 11B.

Next, as illustrated in FIG. 13, substrate 40 is removed exposing interconnect 44. A via hole 50 is etched through planarizing material 41 and into planarizing material 46 to expose a portion of interconnect 47. While one via hole 50 is shown, it is to be understood that any number of vias may be formed in order to make the appropriate connection(s) to the devices in the two bonded substrates.

Interconnect 51 is formed in via hole 50 interconnecting the devices 43 and 48. At this point the process could be stopped if only two wafers were required to be bonded. If one or more devices need to be further integrated, the process may continue by forming a bonding layer 52 made of, for example, silicon dioxide, which is then polished to a surface roughness of 5–10 Å, in the same manner as described above. In this case, the process may include a step of filling any cavity formed in interconnect 50 to more easily produce a smooth surface of layer 52. The device, as shown in FIG. 14 is now ready to be bonded with another wafer, if desired.

For the wafers of different technologies, the planarizing material may be the same. The two different technologies are separated by the layers of planarizing material do not interact. Each only interacts with the planarizing material. Since the properties of the planarizing material are both well known and are commonly used in current processes, no new materials are needed to combine the technologies. The invention provides a very manufacturable manner of combining different technologies.

Moreover, all of the customization takes place at the end of the processing. Both wafers are separately manufactured and then bonded. The interconnection is performed after the bonding. Customization of combined technologies takes place at the end of the process. Whatever technology one needs may be obtained, and these technologies may be those that are readily and commercially available. The need for designing a new process is eliminated. More control over the final combined product is possible as well-defined and devices fabricated with a stable process may be selected for combining, unlike a new, unqualified combined process where little manufacturing, reliability or longer term information is available.

Figure 14:
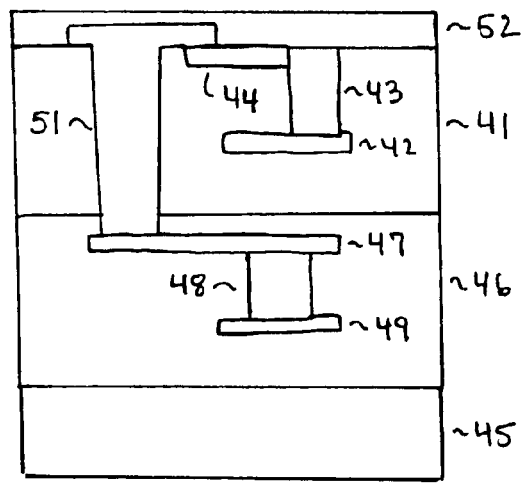
FIG. 14 is a sectional diagram illustrating a step of bonding the bonded devices of FIGS. 11A and 11B to another device.
Figure 15:
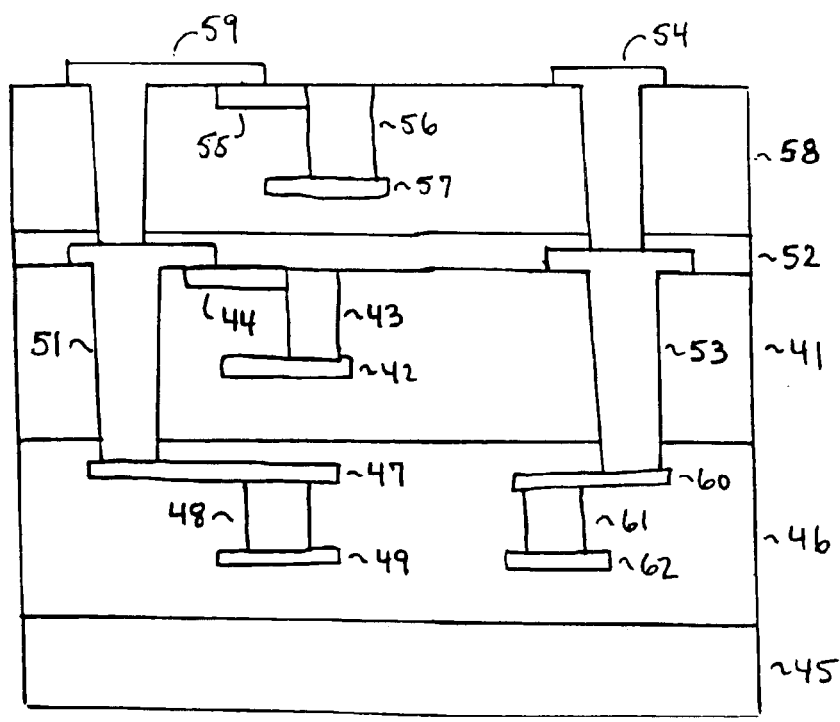
FIG. 15 is a sectional diagram illustrating bonding and interconnecting three devices.

The bonding of a third wafer to the structure of FIG. 14 is illustrated in FIG. 15. It is noted that FIG. 15 illustrates an additional metalization 53 formed by etching planarizing material 41 and 46 to expose a portion of interconnect 60 of another device having elements 60–62. Interconnect 53 has an extended portion on the surface of planarizing material 41 to facilitate interconnection on another level. The device in the third wafer in this case can be a CMOS device 56 having interconnects 55 and 57. Another via is etched through planarizing material 58 and through bonding material 52, exposing a portion of interconnect 51 to allow connection with interconnect 59. Interconnect 59 is also connected with interconnect 55 of CMOS device 56. Another interconnect 54 is formed by etching a via through materials 58 and 52 to expose a portion of interconnect 53. An interconnect 54 is formed to contact interconnect 53. It should be noted that FIG. 15 does not explicitly show the bonding layers formed between the devices but is to be understood that these are the devices are formed using the process described above in connection with the first embodiment.

What is also apparent from FIG. 15 that the present invention utilizes both sides of a contact. For example, if the pad at the top of contact 51 is a contact pad or a metal line, then the bottom surface of the pad (or line) is connected with interconnect 47 lying under the pad (or line) while the tope of the pad (or line) is connected with contact 59 overlapping with interconnect 55. This can reduce drive requirements.

FIG. 15 also illustrates the advantage of the invention of not being constrained to one layer (or possibly two layers) for circuit topography. One has the ability to design three dimensionally. Circuit layouts can be optimized if one is given the ability to separate a type or class of device from others where either the functioning or processing interferes or is incompatible. Circuit layouts are minimized in area since three dimensions are used instead of only two. For example, three conventional chips of nominally the same area with optionally different technologies can be implemented in one third the area by stacking vertically. The area reduction is even greater if one considers the reduced packaging requirements of the individual chips vs. the stacked chips. Stacking vertically is also conducive to the insertion of ground, bias, or other planes between chips or within a chip for improved signal isolation during routing.

Typically, in a system signals are amplified and then transmitted over buses between integrated circuits. This requires a lot of level-shifting, buses and compensation for various differences in signal levels amongst the elements making up the system. As one example, a pixel in a light detecting device receives a very small packet of charge which is then shifted out of the device and into a memory device. The light detecting device and the memory in this case may both be separate integrated circuits, requiring amplification of the charge packet through buffers and system buses between the pixel and memory device. The signal levels are then shifted down in order to store the information in a memory cell in the memory device. When the information in the memory is needed to be processed, the information is then level-shifted again using more buffers and system buses to transmit the data over to a processor, which also may be formed using a separate integrated circuit. The power levels for the various signals are determined by the interconnection and the buses.

Figure 16A:
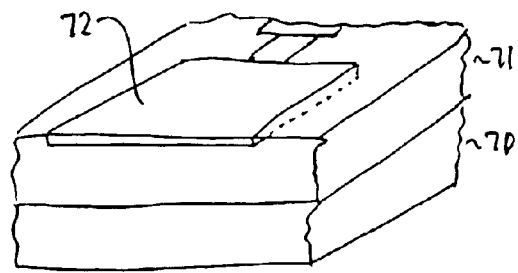
FIGS. 16A–16D are diagrams illustrating bonding three integrated circuits.
Figure 16B:
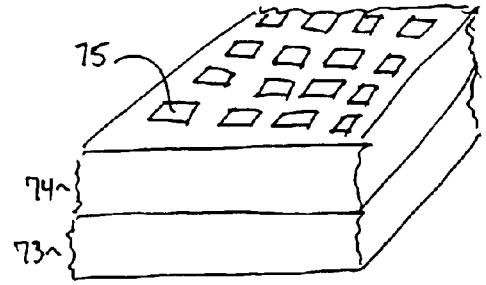

The present invention allows one to obtain element-to-element communication and addressability. In the present, the power levels of signals may be determined by the element, and not the interconnect, i.e., the system buses and drivers. As an example, as shown in FIGS. 16A-16D, a first integrated circuit consisting of an array of pixels for sensing a light signal, etc. is fabricated on a first substrate (FIG. 16A). In simplified fashion, the a pixel 72 is formed in a semiconductor layer 71, which is formed on a substrate 70. On a second substrate is fabricated the memory device needed to store the information when it is shifted out of the pixel array, and is shown in FIG. 16B. A semiconductor layer 74 is formed on a substrate 73. Memory cells 75 are formed in layer 74. Lastly, a processor device for processing the information is manufactured on a third substrate shown in FIG. 16C. Various elements 78 are shown (in simplified form) in layer 77 formed on substrate 76. Each of the substrates may then be bonded together (with the pixel array on top in order to expose it to the light).

The three substrates may be bonded together. A surrogate substrate (not shown) may be attached to an upper surface of layer 71 using the techniques described above, and substrate 70 removed. The upper surface of layer 74 of the memory device is then bonded to the surface exposed by removing substrate 70. Substrate 73 may then be removed, and the upper surface of layer 77 is bonded to the surface exposed by removing substrate 73. The surrogate substrate may be removed to expose the pixels 72. The interconnections may be made directly between the three substrates, in the manner discussed above, eliminating the need for the numerous buffers and system buses required to interconnect the system when the system is designed using separate integrated devices. The bonded circuit is shown in FIG. 16D. It should be noted that FIG. 16D does not illustrate the various layers used to bond the different devices, and the portions of the layers 71, 74 and 77 may be removed during the removal of the corresponding substrates, as desired.

Another example would be a typical microprocessor where the microprocessor contains a certain amount of on-board ROM while a larger amount of storage is accessed via system buses on a separate RAM. In this case, the processor with the on-board ROM may be fabricated on a first substrate and the memory may be fabricated on a second substrate. The two substrates are to be bonded together and the processor directly bonded to the memory device, again eliminating the need for system buses, level shifters and other buffers.

The present invention not only allows the fabrication of systems in a more compact and directly accessible manner, but also allows a smaller footprint. Each of the separate devices described above would take up at least three times the amount of space compared to the present invention they are stacked upon each other, assuming chips of about the same size.

A fourth embodiment of the invention uses the techniques described above to create the interconnect separately from the underlying integrated circuit. Typically, circuits require a number of levels of interconnect in order to provide all the complex functions required. Six or more levels of interconnect may be needed. This requires a significant amount of thermal processing, exposing the underlying active devices to higher thermal budgets and complicating the fabricating process. The present invention may be used to fabricate the active devices separately and then forming layers of interconnect by bonding according to the present invention. In particular, each level of interconnect may be formed on separate substrates, then bonded together and interconnected as needed. Several or all of the interconnect layers may be fabricated at one time. The bonded together or single interconnected substrate may then be bonded to the substrate having the active devices. Techniques similar to those described above for interconnecting the different wafers shown in FIG. 15 may be employed. When finished, the stack of interconnected layers may be bonded to the active devices.

Figure 16C:
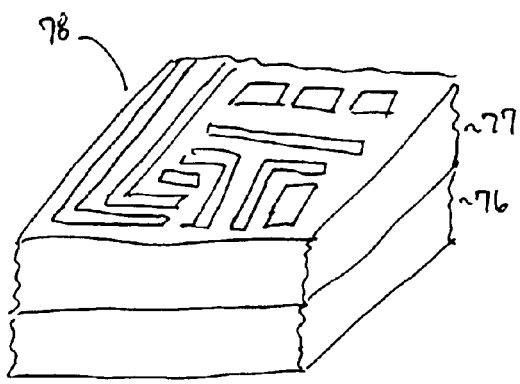
Figure 16D:
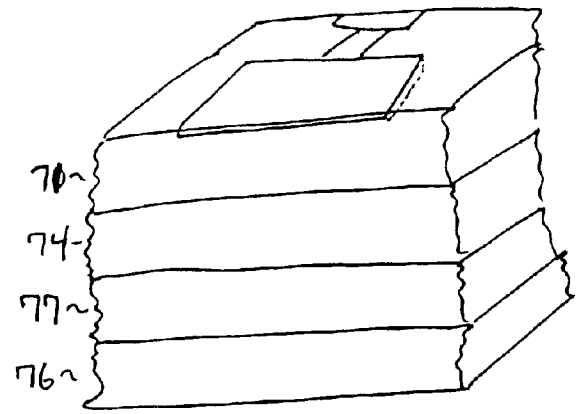
Figure 17A:
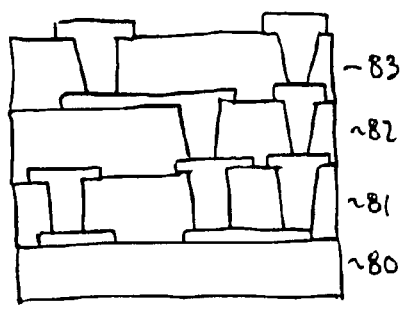
FIG. 17A is a diagram of a layered interconnect structure.
Figure 17B:
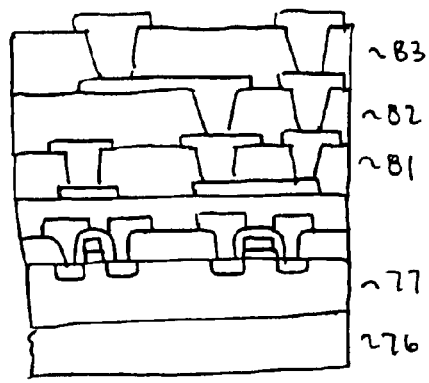
FIG. 17B is a diagram of bonding the layered interconnect structure of FIG. 17A to an substrate having integrated circuits.

This is illustrated in FIGS. 17A and 17B, where a stack of interconnect having layers 80–83 is bonded according to the principles of the invention and shown in FIG. 17A is then bonded to the integrated circuit shown in FIG. 16B or 16C. FIG. 17B shows the completed device with the layers used in the bonding process omitted for clarity. In this case, the substrate of the integrated circuit may be removed and bonded to a more favorable thermal material, such as diamond-like carbon. With this embodiment, one can obtain tighter processing control by not having to compensate or make compromises for the various effects of the increased thermal budget due to the typical processing of the multiple layers of integrated circuit interconnection on top of the active devices.

Another application of the invention is the selection of the interconnect layers. By being able to separately process the interconnect, more design flexibility may by obtained. Certain layers, for example those handling high speed signals, may be more critical than others. The critical levels may be separated from each other by other non-critical layers to minimize overlap. Conversely, non-critical layers may be put in adjacent layers when the overlap is not a problem for high speed operation of the device.

Figure 18:
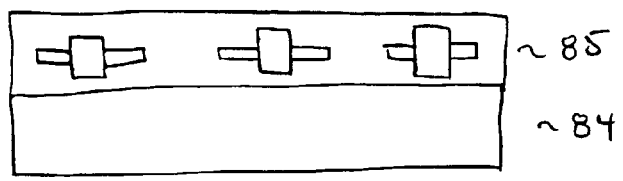
FIG. 18 is a diagram of a 2-D array of circuit elements.

Apparent from the above embodiments, the substrate of the integrated circuits may be completely removed in the above embodiments. The result is a 2-D array of device elements immersed in insulative planarizing material. One example of this is shown in FIG. 18. Each of the elements may be completely isolated from every other element, i.e., a 2-D array of devices as opposed to a circuit layer. A second wafer to be bonded may be processed in the same way, giving another 2-D array of device elements. The arrays of devices may then be interconnected in a desired manner to create circuits, subcircuits, etc. This can be extended to bonding different technologies together, for example, CMOS and bipolar, to create a BiCMOS wafer. In this case the most advanced CMOS and bipolar technologies may be combined since the two wafers are separately processed. One can then, when needing to create a combined technology device or circuit, use existing advanced, qualified technologies rather than having to design a new combined process or settle for an existing combined technology which does not use and cannot take advantage of the most advanced technologies or evolutions in technologies.

Figure 19:
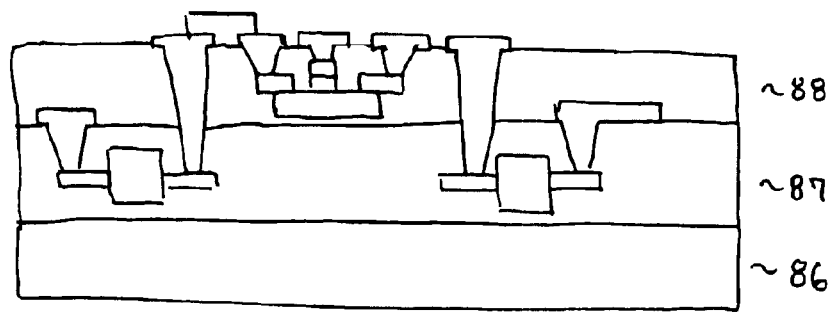
FIG. 19 is a diagram of bonded and interconnected 2-D arrays of circuit elements.

Third wafer and subsequent wafers may also be processed where the substrate is removed to create a 2-D array of devices ready to be bonded to the first and second arrays. The third device may be yet another technology. FIG. 19 gives an example.

While particular devices and materials have been described in connection with the first and second embodiments, the invention is not so limited. The invention is applicable to any type of device formed on any type of substrate. Moreover, any type of technology may be used to fabricate the devices being bonded. For example, GaAs devices on a GaAs substrate may be bonded to HBT devices. Also, silicon-based devices formed on silicon wafers may also be bonded to either the GaAs-based devices or the HBT type devices. Technologies such as CMOS, BiCMOS, npn and pnp HBT, VCSEL, PIN, HFET, MESFET, MOSFET, and JFET may also be used.

The method according to the invention provides a three-dimensional, laminar integrated circuit structure. The device is a multi-chip module having a high integration density with reduced interconnection parasitics compared to other multi-chip modules. The module offers great flexibility as it can combine different devices and different technologies.

Obviously, numerous modifications and variations of the present invention are possible in light of the above teachings. It is therefore to be understood that within the scope of the appended claims, the invention may be practiced otherwise than as specifically described herein.

What is claimed as new and desired to be protected by Letters Patent is:

1. An integrated structure, comprising:
   a first element having a plurality of first metallic contact structures;
   a second element comprising a plurality of second metallic contact structures, a substantial portion of second element being removed by at least one of grinding and polishing;

a first oxide layer disposed on a surface of said first element, said first oxide layer having a first polished surface with a surface roughness in a surface roughness range;

a second oxide layer disposed on a surface of said second element, said second oxide layer having a second polished surface with a surface roughness in said range of surface roughness; and an interconnection formed between said at least one of said first metallic contact structures and at least one of said second metallic contact structures, wherein said first oxide layer is directly bonded to said second oxide layer through said first and second polished surfaces without application of temperature and with a bond strength sufficient to permit removal of said portion of said second element after bonding said first and second oxide layers.

2. A structure as recited in claim 1, comprising:

said first and second polished surfaces having a surface roughness in a range of about 5–15 Å.

3. A structure as recited in claim 1, comprising:

said first and second polished surfaces having a surface roughness in a range of about 5–10 Å.

4. A structure as recited in claim 1, comprising:

said first and second polished surfaces having a surface roughness of no more than about 5 Å.

5. A structure as recited in claim 1, comprising:

an opening, formed through said second element, said first and second oxide layers, and a portion of said first element, to which a first one of said plurality of first metallic contact structures is exposed; and said interconnection being farmed in said opening and in contact with said first one of said plurality of first metallic contact structures.

6. A structure as recited in claim 1, wherein:

said second element comprises a substrate; and a portion of said substrate is removed to leave a remaining portion of said second element.

7. A structure as recited in claim 6, comprising:

substantially all of said substrate being removed.

8. A structure as recited in claim 1, wherein:

said first and second elements comprise respective first and second semiconductor devices; and said first and second semiconductor devices are of different technologies.

9. A structure as recited in claim 1, wherein:

said first and second oxide layers each comprises a material having a dielectric constant in the range of approximately 1–3 and a thermal conductivity in the range of approximately 1–10 W/cmK.

10. A structure as recited in claim 1 wherein each of said first and second oxide layers comprises a silicon oxide.

11. A structure as recited in claim 1, wherein said first oxide layer is directly bonded to said second oxide layer through said first and second polished surfaces without application of temperature or pressure during bonding.

12. A structure as recited in claim 1, wherein:

said first element comprises a first material;

said first plurality of metallic contact structures extend above said first material; and said first oxide layer is disposed on said first plurality of metallic contact structures and said first material.

13. A structure as recited in claim 12, wherein:

said first plurality of metallic contact structures extend above said first material by a distance; and said first oxide layer has a thickness no more than to times said distance.

14. A structure as recited in claim 12, wherein:

said second oxide layer comprises a second material;

said second plurality of metallic contact structures extend above said second material; and said second layer is disposed on said second plurality of metallic contact structures and said second material.

15. A structure as recited claim 1, wherein said first and second oxide layers comprise first and second bonding layers, respectively.

16. A structure as recited in claim 1, wherein each of said first and second metallic contact structures consists essentially of a metal material.

17. A structure as recited in claim 1, comprising:

said first oxide layer directly bonded to said second oxide layer through said first and second polished surfaces by placing said first and second polished surfaces in contact without application of pressure.

18. An integrated structure, comprising:

a first element;

a second element having a first semiconductor device formed in a substrate, a substantial portion of said substrate being removed by at least one of grinding and polishing;

a first bonding layer, having a first polished surface, disposed on a top surface of said first element;

a second bonding layer, having a second polished surface, disposed on a top surface of said first semiconductor device; and said first bonding layer directly bonded to said second bonding layer without application of temperature and with a strength sufficient to permit removal of said portion of said substrate after bonding said first and second bonding layers.

19. A structure a recited in claim 18, comprising:

a first plurality of metal contact structures disposed in said first element;

a second plurality of metal contact structures disposed in said second element; and an interconnection formed between one said first metal contact structures and one of said second metal contact structures.

20. A structure as recited in claim 18, comprising:

said first and second bonding layers having respective first and second surfaces polished to a surface roughness in a range of about 5–15 Å, said first and second surfaces being bonded together.

21. A structure as recited in claim 18, comprising:

said first and second bonding layers having respective first and second surfaces polished to a surface roughness in a range of about 5–10 Å, said first and second surfaces being bonded together.

22. A structure as recited in claim 18, comprising:

said first and second bonding layers having respective first and second surfaces polished to a surface roughness of no more than about 5 Å, said first and second surfaces being bonded together.

23. A structure as recited in claim 18, wherein each of said first and second bonding layers comprises a silicon oxide layer.

24. A structure as recited in claim 18, comprising:
a first contact structure in said first element;
a second contact structure in said second element;
an opening, formed through said second element, said first and second bonding layers, and a portion of said first element, to which said first contact structure is exposed; and
an interconnection being formed in said opening and in contact with said first and second contact structures.

25. A structure as recited in claim 24, wherein each of said first and second contact structures consists essentially of a metal material.

26. A structure as recited in claim 18, comprising:
substantially all of said substrate being removed.

27. A structure as recited in claim 18, wherein said first element comprises a semiconductor device, said semiconductor devices in said first and second elements being of different technologies.

28. A structure as recited in claim 18, wherein:
said first and second bonding layers each comprises a material having a dielectric constant in the range of approximately 1–3 and a thermal conductivity in the range of approximately 1–10 W/cmK.

29. A structure as recited in claim 18,
wherein said first oxide layer is directly bonded to said second oxide layer through said first and second polished surfaces without application of temperature or pressure during bonding.

30. A structure as recited in claim 18, comprising:
said first bonding layer directly bonded to said second bonding layer through said first and second polished surfaces by placing said first and second polished surfaces in contact without application of pressure.

31. An integrated structure, comprising:
a first element having a first surface polished to a surface roughness of no more than 15 Å;
a second element having a second surface to which at least one of grinding and polishing operation has been performed, and a third surface polished to a surface roughness of no more than 15 Å;
wherein said first surface is bonded in direct contact with said third surface at about room temperature with a bond strength sufficient to permit at least one of grinding and polishing of said second surface after bonding said first and third surfaces.

32. A structure as recited in claim 31, comprising:
a first metal contact structure disposed in said first element;
a second metal contact structure disposed in said second element; and
an interconnection formed between said first and second metal contact structures.

33. A structure as recited in claim 31, comprising:
said first and third surfaces having a surface roughness in a range of about 5–15 Å.

34. A structure as recited in claim 31, comprising:
said first and third surfaces having a surface roughness in a range of about 5–10 Å.

35. A structure as recited in claim 31, comprising:
said first and third surfaces having a surface roughness in a range of no more than about 5 Å.

36. A structure as recited in claim 31, wherein each of said first and third surfaces comprises a surface of a silicon oxide layer.

37. A structure as recited in claim 31, comprising:
a first contact structure in said first element;
a second contact structure in said second element;
an opening, formed through said second element and a portion of said first element, to which said first contact structure is exposed; and
an interconnection being formed in said opening and in contact with said first and second contact structures.

38. A structure as recited in claim 37, wherein each of said first and second contact structures consists essentially of a metal material.

39. A structure as recited in claim 31, wherein:
said second element comprises a substrate; and
substantially all of said substrate is removed.

40. A structure as recited in claim 31, wherein:
said first element comprises a first semiconductor device,
said second element comprises a second semiconductor device; and
said first and second semiconductor devices are of different technologies.

41. A structure as recited in claim 31, wherein:
said first and third surfaces each comprises a surface of a material having a dielectric constant in the range of approximately 1–3 and a thermal conductivity in the range of approximately 1–10 W/cmK.

42. A structure as recited in claim 31,
wherein said first surface is bonded in direct contact with said third surface at about room temperature without application of pressure during bonding with a bond strength sufficient to permit at least one of grinding and polishing of said second surface after bonding said first and third surfaces.

43. A structure as recited in claims 1, wherein said first oxide layer is nonadhesively directly bonded to said second oxide layers.

44. A structure as recited in claim 18, wherein said first bonding layer is nonadhesively directly bonded to said second bonding layer.

45. A structure as recited in claim 31, wherein said first surface is nonadhesively bonded in direct contact with said third surface.

* * * * *